(12) United States Patent
Bahr et al.

(10) Patent No.: US 10,985,729 B2
(45) Date of Patent: Apr. 20, 2021

(54) BAW RESONATOR BASED PRESSURE SENSOR

(71) Applicant: TEXAS INSTRUMENTS INCORPORATED, Dallas, TX (US)

(72) Inventors: Bichoy Bahr, Richardson, TX (US); Baher S. Haroun, Allen, TX (US); Benjamin Stassen Cook, Addison, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 97 days.

(21) Appl. No.: 16/235,512

(22) Filed: Dec. 28, 2018

(65) Prior Publication Data

US 2020/0212879 A1 Jul. 2, 2020

(51) Int. Cl.
*G01L 11/00* (2006.01)
*H03H 9/02* (2006.01)
(Continued)

(52) U.S. Cl.
CPC ............. *H03H 9/17* (2013.01); *G01L 9/0008* (2013.01); *G01L 21/08* (2013.01); *G01R 23/02* (2013.01); *H03H 9/02015* (2013.01)

(58) Field of Classification Search
CPC ..... G01L 19/147; G01L 9/0042; G01L 19/04; G01L 9/0054; G01L 9/0072; G01L 13/025; G01L 19/14; G01L 19/0038; G01L 19/0084; G01L 9/0055; G01L 9/0075; G01L 19/0069; G01L 9/0052; G01L 9/0073; G01L 19/0092; G01L 19/0618; G01L 19/0645; G01L 19/143; G01L 9/0051; G01L 19/0007; G01L 19/0046; G01L 19/06; G01L 19/0627; G01L 19/0681; G01L 27/002; G01L 9/00; G01L 9/0041; G01L 9/0044; G01L 11/025; G01L 11/04; G01L 19/0023; G01L 19/0672; G01L 19/069; G01L 19/142; G01L 19/145; G01L 19/16; G01L 7/00; G01L 9/0047; G01L 9/06; G01L 9/065; G01L 9/12; G01L 11/02; G01L 13/00; G01L 15/00; G01L 19/0015; G01L 19/003; G01L 19/02; G01L 19/0609; G01L 19/083; G01L 19/10;
(Continued)

(56) References Cited

U.S. PATENT DOCUMENTS 10,672,748 B1 * 6/2020 Parvarandeh ........... H01L 25/10
2002/0093398 A1 * 7/2002 Ella .......................... H03H 9/105
333/187

(Continued)

*Primary Examiner* — Andre J Allen
(74) *Attorney, Agent, or Firm* — Valerie M. Davis; Charles A. Brill; Frank D. Cimino

(57) ABSTRACT

A pressure sensor apparatus is disclosed. The pressure sensor apparatus includes a bulk acoustic wave (BAW) die having a die interface side and a pressure contact side, a sensor BAW resonator and a reference BAW resonator disposed on the die interface side of the BAW die, a control circuit die coupled to the die interface side of the BAW die via an attachment layer, and an extended opening on the pressure contact side that extends into a depth of the BAW die and is generally aligned with the sensor BAW resonator, the extended opening being configured to translate an external pressure on the pressure contact side onto the sensor BAW resonator.

29 Claims, 14 Drawing Sheets

(51) Int. Cl.
*H03H 3/02* (2006.01)
*G01L 7/00* (2006.01)
*H03H 9/17* (2006.01)
*G01R 23/02* (2006.01)
*G01L 21/08* (2006.01)
*G01L 9/00* (2006.01)

(58) Field of Classification Search
CPC ....... G01L 19/148; G01L 27/005; G01L 7/08;
G01L 7/082; G01L 7/163; G01L 7/166;
G01L 9/0045; G01L 9/0048; G01L 9/006;
G01L 9/007; G01L 9/0076; G01L 9/04;
G01L 9/045; G01L 9/125; G01L 11/00;
G01L 17/00; G01L 19/00; G01L 19/0076;
G01L 19/08; G01L 19/141; G01L 19/146;
G01L 1/142; G01L 1/2262; G01L 1/246;
G01L 21/12; G01L 23/16; G01L 27/007;
G01L 7/04; G01L 7/063; G01L 7/084;
G01L 7/086; G01L 7/16; G01L 9/0002;
G01L 9/0007; G01L 9/0016; G01L
9/0019; G01L 9/0022; G01L 9/0027;
G01L 9/0033; G01L 9/0039; G01L 9/005;
G01L 9/0058; G01L 9/0077; G01L
9/0079; G01L 9/008; G01L 9/0092; G01L
9/0095; G01L 9/025; G01L 9/08; G01L
9/085; G01L 9/105; G01L 9/14; G01L
9/16; H01L 2224/48091; H01L
2924/00014; H01L 2224/48137; H01L
2224/48145; H01L 2224/73265; H01L
2924/00012; H01L 2224/04105; H01L
2224/24137; H01L 2224/49175; H01L
24/19; H01L 2924/1461; H01L
2924/1815; H01L 2924/18162; H01L
29/84; H01L 41/047; H01L 41/0475;
H01L 41/1132
USPC .................................................... 73/700–756
See application file for complete search history.

(56) References Cited

U.S. PATENT DOCUMENTS

| | | | |
|---|---|---|---|
| 2015/0318461 A1* | 11/2015 | Jacobsen | H03H 9/17 331/155 |
| 2019/0103851 A1* | 4/2019 | Yusuf | H03H 9/54 |
| 2019/0341885 A1* | 11/2019 | Jackson | H01L 23/49575 |
| 2020/0056948 A1* | 2/2020 | Pohl | G01L 9/0025 |
| 2020/0076366 A1* | 3/2020 | Bahr | H01L 41/047 |
| 2020/0127633 A1* | 4/2020 | Takano | H03F 3/189 |
| 2020/0153387 A1* | 5/2020 | Jackson | H01L 9/105 333/187 |

* cited by examiner

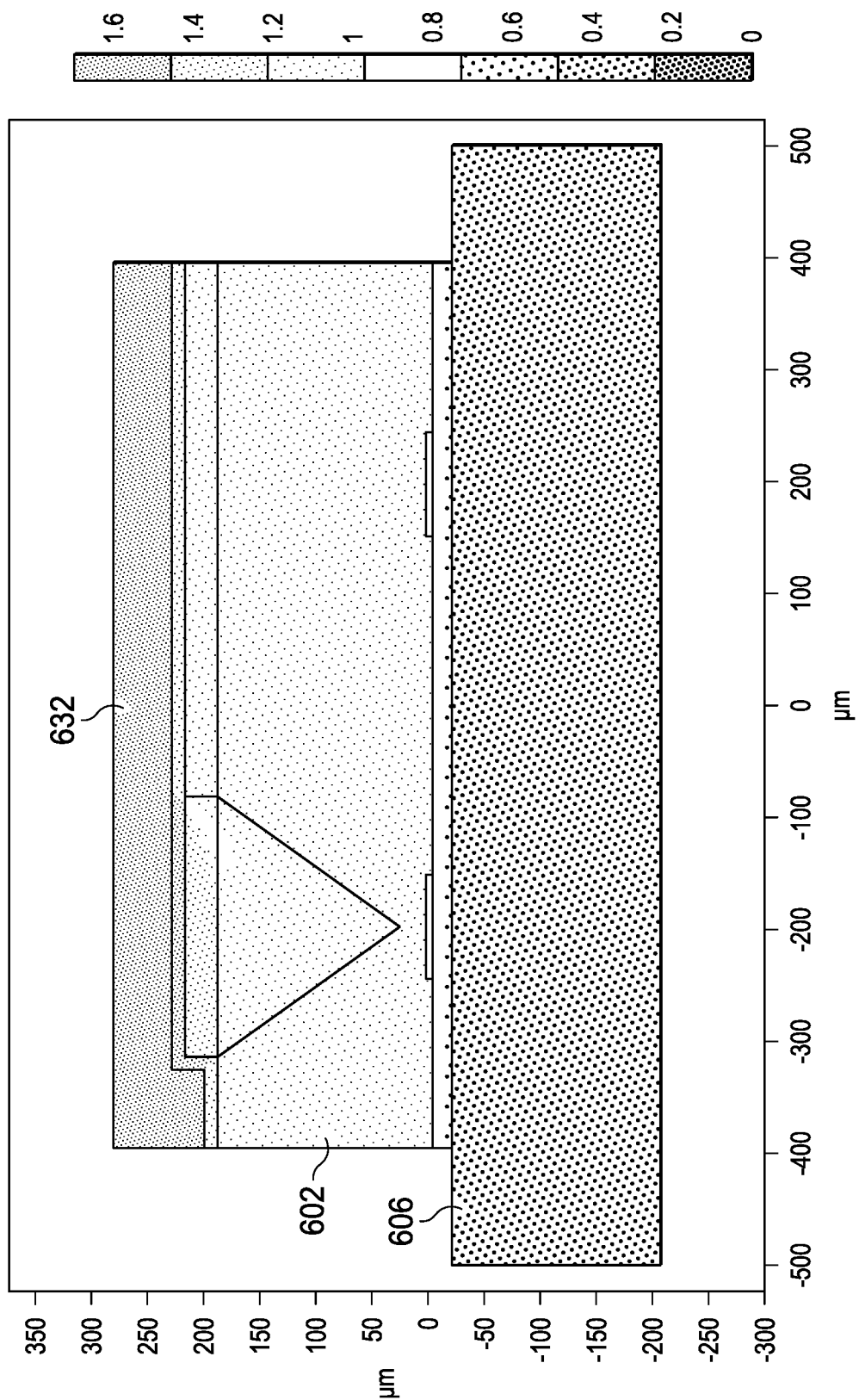

BAW RESONATOR BASED PRESSURE SENSOR

TECHNICAL FIELD

This relates to pressure sensors, or more particularly to a bulk acoustic wave resonator-based pressure sensor.

BACKGROUND

A bulk acoustic wave (BAW) resonator device includes a piezoelectric material sandwiched between two electrodes and acoustically isolated from the surrounding medium. Common materials used for the piezoelectric material are aluminum nitride and zinc oxide. A typical BAW resonator device resonates in the frequency range of roughly 100 MHz to 10 GHz. BAW resonator devices can be used for sensor applications because when a BAW resonator device is put under mechanical pressure, its resonance frequency will shift. Applying a voltage or temperature change to a BAW resonator will also result in a shift of its characteristic frequency.

SUMMARY

In one example, a pressure sensor apparatus is disclosed. The pressure sensor apparatus includes a BAW die having a die interface side and a pressure contact side, a sensor BAW resonator and a reference BAW resonator disposed on the die interface side of the BAW die, a control circuit die coupled to the die interface side of the BAW die via an attachment layer, and an extended opening on the pressure contact side that extends into a depth of the BAW die and is generally aligned with the sensor BAW resonator, the extended opening being configured to translate an external pressure on the pressure contact side onto the sensor BAW resonator.

In another example, a method of fabricating a pressure sensor apparatus is disclosed. The method includes providing a BAW die having a die interface side and a pressure contact side, the BAW die having a sensor BAW resonator and a reference BAW resonator disposed at different locations on the die interface side of the BAW die. The method further includes coupling a control circuit die to the die interface side of the BAW die via an attachment layer, and etching an extended opening on the pressure contact side that extends into a depth of the BAW die and is generally aligned with the sensor BAW resonator. The extended opening is configured to translate an external pressure applied to the pressure contact side of the BAW die onto the sensor BAW resonator.

In yet another example, a tactile sensor apparatus is disclosed. The tactile sensor apparatus includes a plurality of sensor BAW resonators, a reference BAW resonator, a cap configured to accept an external pressure, and a plurality of extended openings, each extended opening corresponding to a respective one of the plurality of sensor BAW resonators and configured to translate the external pressure applied to a respective portion of the cap to the respective one of the plurality of sensor BAW resonators.

BRIEF DESCRIPTION OF THE DRAWINGS

FIG. 6E depicts displacement distribution of a BAW resonator SSS during an FEM simulation.

DETAILED DESCRIPTION

A BAW resonator includes a piezoelectric layer sandwiched between two metal electrodes. When an electrical signal is applied to a BAW resonator between the two electrodes, the BAW resonator will demonstrate a high impedance at a specific resonance frequency. If an oscillator circuit is applied to the BAW resonator, the oscillator will start to oscillate at the specific frequency. Moreover, if a pressure is applied to the surface of the BAW resonator, or if the BAW resonator is compressed, the frequency will shift. Thus, by measuring the output frequency of the applied oscillator, the magnitude of the applied pressure can be estimated.

The resonance frequency of the BAW resonator is in part determined by the thickness of the piezoelectric material. A common material used for the piezoelectric material is aluminum nitride. When pressure is applied, the dimensions of the piezoelectric material and other associated layers of the BAW resonator change (e.g., parts per million change) sufficient to cause a noticeable shift in resonance frequency such that the frequency shift can be used to calculate the amount of pressure applied to the entire structure.

The relationship between the amount of pressure applied and the generated frequency shift is approximately linear. For example, if the frequency shifts by 1 MHz then it can be estimated that there have been 100 kilopascals applied to the BAW resonator mechanical structure, and if the frequency shifts by 5 MHz then it can be estimated that 500 kilopascals have been applied to the mechanical structure, etc. Accordingly, disclosed herein is bulk acoustic wave resonator-based pressure sensor apparatus and a method of fabricating a bulk acoustic wave resonator-based pressure sensor.

Comparing the frequency of a sensor BAW resonator a reference BAW resonator allows a determination of an accurate corrected pressure value. In some examples, a linear response region of the measurement includes BAW die sensitivity measured to be approximately 110 parts per million (ppm)/megapascals (MPa), and external pressure sensitivity measured to be approximately 55 ppm/MPa. Accordingly, the BAW resonator pressure sensor apparatus described herein is suitable for high pressure applications. In one example, the BAW resonator pressure sensor described herein is relatively small. Example dimensions include a total thickness of about 400 um, including a 190 um control circuit die, a 190 um BAW die, and a 20 um die attachment layer. A lateral size of the BAW resonator pressure sensor apparatus is in some examples determined by the lateral size of the control circuit die.

Figure 1:
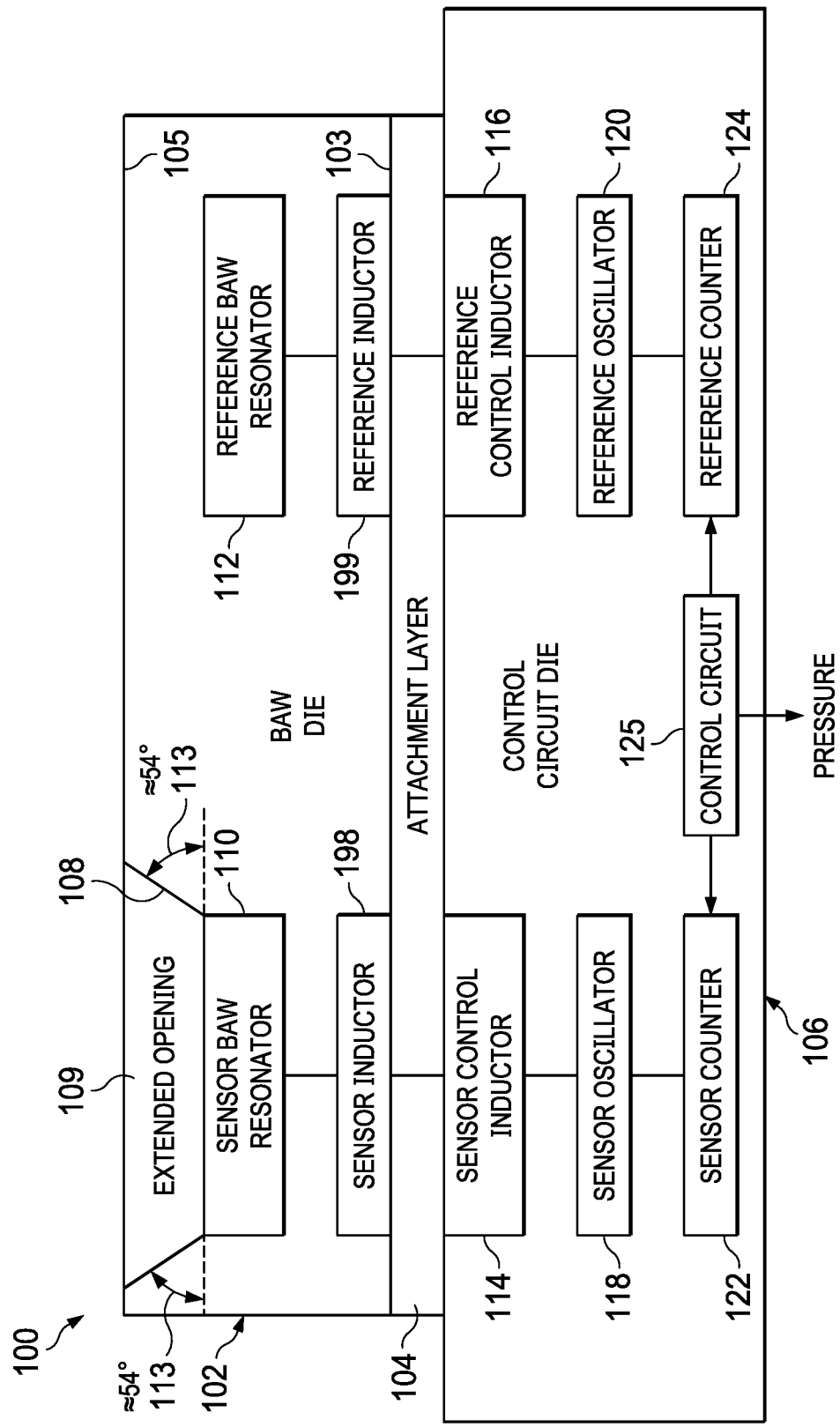
FIG. 1 is a block diagram of an example BAW resonator pressure sensor.

FIG. 1 is a block diagram of an example BAW resonator pressure sensor 100. The BAW resonator pressure sensor 100 includes a BAW die 102 having a die interface side 103 and a pressure contact side 105. A sensor BAW resonator 110 and a reference BAW resonator 112 are disposed on the die interface side 103 of the BAW die 102. The BAW resonator pressure sensor 100 also includes a control circuit die 106 coupled to the die interface side 103 of the BAW die 102 via an attachment layer 104. In some examples, the control circuit die 106 is a complementary metal-oxide-semiconductor (CMOS) die. In some examples, the attachment layer 104 is a dielectric material. In some examples, the attachment layer 104 is made of polydimethylsiloxane (PDMS), bismaleimide, or soft die attach glue.

An extended opening 108 on the pressure contact side 105 extends into a depth of the BAW die 102 and is generally aligned with the sensor BAW resonator 110. The extended opening 108 is configured to translate an external pressure applied to the pressure contact side 105 onto the sensor BAW resonator 110. Put another way, the extended opening 108 funnels and, in some implementations, concentrates an external pressure applied to the pressure contact side 105 onto the sensor BAW resonator 110. The extended opening can be of any shape. In some examples, the extended opening 108 is generally funnel-shaped. In some examples, the extended opening 108 is filled with a soft material 109 having a Young's modulus of less than 20 MPa. In some examples, the extended opening 108 is made of PDMS, bismaleimide, or soft die attach glue. In other examples, the extended opening 108 is exposed to the outside environment of air, liquid, and/or gas. In some examples, the extended opening 108 is fabricated using an etch chemical process along the pressure contact side 105, such as a potassium hydroxide (KOH) etch, a tetramethylammonium hydroxide (TMAH) etch, or a deep reactive-ion etching (DRIE) etch. In the example shown in FIG. 1, the extended opening 108 has a sloped sidewall angle 113 (on both sides) of about 54°. However, the shape of the extended opening 108 can vary and can be of many different shapes (e.g., the sloped sidewall angle 113 (on either side) can be an angle other than 54°).

As further shown in FIG. 1, the sensor BAW resonator 110 is coupled to a sensor inductor 198 on the BAW die 102, while the reference BAW resonator 112 is coupled to a reference inductor 199 on the BAW die 102. The control circuit die 106 includes a sensor control inductor 114 inductively coupled to the sensor inductor 198 of the sensor BAW resonator 110. A sensor oscillator 118 is coupled to the sensor control inductor 114. The sensor oscillator 118 is coupled to a sensor counter 122. The sensor counter 122 is configured to count an oscillation frequency of the sensor oscillator which is determined by the sensor BAW resonator 110 resonance frequency and hence the externally applied pressure. The resonance frequency, in some examples, shows substantially minimal (e.g., weak) dependence on the mutual inductance of the sensor inductor 198 and sensor control inductor 114.

A reference control inductor 116 is inductively coupled to the reference inductor 199 of the reference BAW resonator 112. A reference oscillator 120 is coupled to the reference control inductor 116. The reference oscillator 120 is coupled to a reference counter 124. The reference counter 124 is configured to count an oscillation frequency of the reference oscillator 120. A control circuit 125 embedded within the control circuit die 106 is configured to read the sensor counter 122 to determine a sensor BAW resonator frequency, and the reference counter 124 to determine a reference BAW resonator frequency. A magnitude of an external pressure applied to the pressure contact side 105 of the BAW die 102 is determined by adjusting a count value associated with the reference BAW resonator 112 based on a count value associated with the sensor BAW resonator 110 to determine an adjusted frequency value, which can be converted to a corresponding pressure value. The control circuit 125 can then provide a pressure value as an output.

Figure 2:
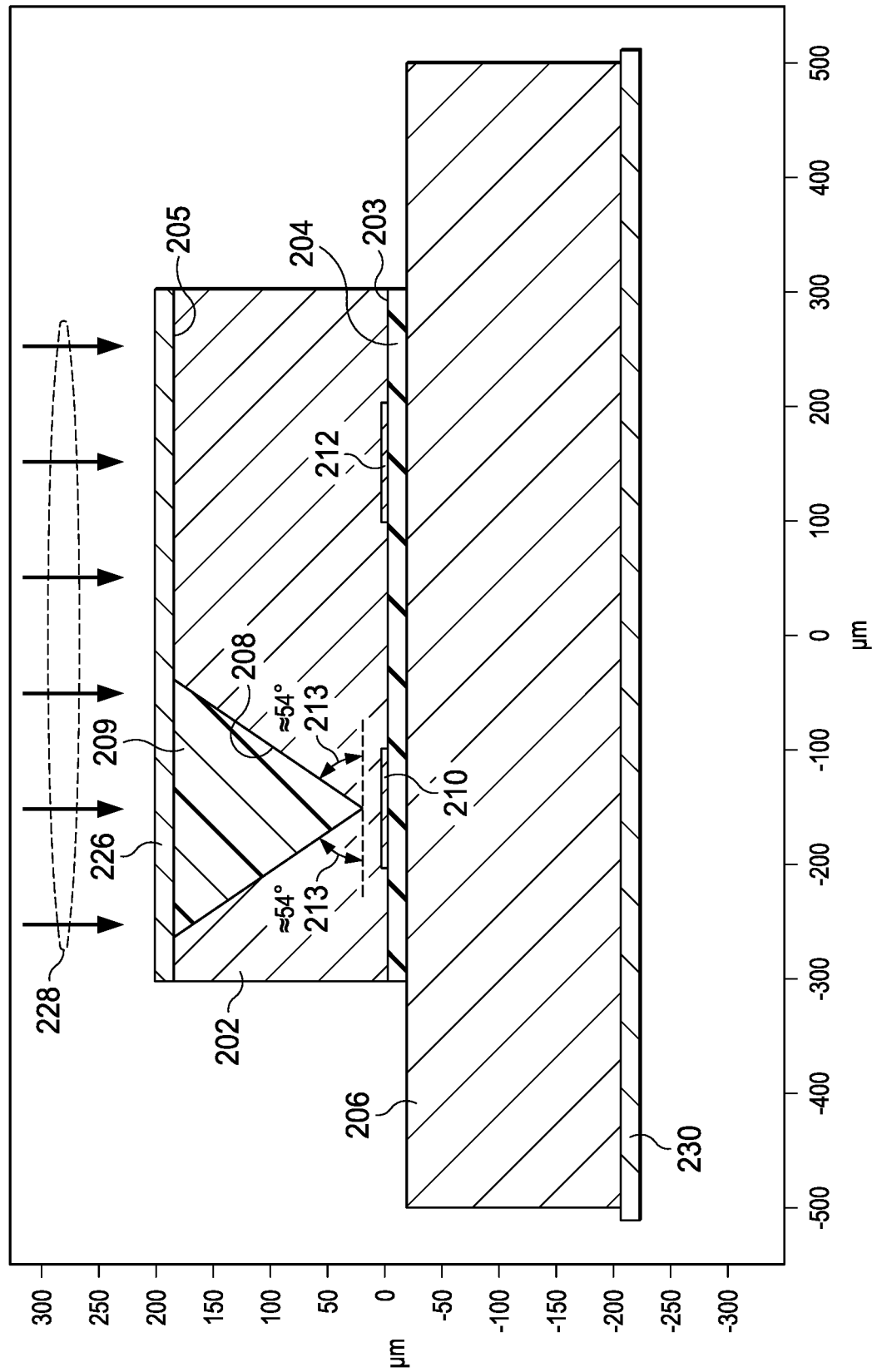
FIG. 2 depicts a cross-sectional view of another example BAW resonator pressure sensor.

FIG. 2 depicts a cross-sectional view of another example BAW resonator pressure sensor 200. As shown in FIG. 2, the BAW resonator pressure sensor 200 device is approximately 1000 micrometers (μm) wide (spanning a width along the shown dimensions from approximately −500 μm to approximately 500 μm) and approximately 425 μm tall (spanning a height along the shown dimensions from approximately −225 μm to approximately 200 μm). The BAW resonator pressure sensor 200 includes a lid 226 configured to cover a surface of the BAW die 202 on the pressure contact side 205. In some examples, the lid 226 is a hard material such as metal or silicon. A sensor BAW resonator 210 and a reference BAW resonator 212 are disposed on a die interface side 203 of the BAW die 202. The BAW resonator pressure sensor 200 also includes a CMOS die 206 coupled to the die interface side 203 of the BAW die 202 via an attachment layer 204. In some examples, the PDMS, bismaleimide, or soft die attach glue. The CMOS die 206 includes the oscillators and control configured to determine an amount of an external pressure 228 applied to the lid 226 and more generally, the amount of external pressure 228 applied to the BAW resonator pressure sensor 200 device.

The BAW resonator pressure sensor 200 includes an extended opening 208 on the pressure contact side 205 that extends into a depth of the BAW die 202 and is generally aligned with the sensor BAW resonator 210. In the example shown in FIG. 2, the extended opening 208 has a sloped sidewall angle 213 (on both sides) of about 54°. However, the shape of the extended opening 208 can vary and can be of many different shapes (e.g., the sloped sidewall angle 213 (on either side) can be an angle other than 54°). The extended opening 208 is configured to translate the external pressure 228 applied to the pressure contact side 205 onto the sensor BAW resonator 210. Put another way, the extended opening 208 funnels and, in some implementations, concentrates the external pressure 228 applied to the lid 226 on the pressure contact side 205 onto the sensor BAW resonator 210. In FIG. 2, the extended opening 208 is generally funnel-shaped, and is filled with a soft material 209 having a Young's modulus of less than 20 megapascals such as PDMS, bismaleimide, or soft die attach glue. The BAW resonator pressure sensor 200 also includes a fixed boundary 230 to separate the BAW resonator pressure sensor 200 from other material or objects.

A magnitude of the external pressure 228 applied to the lid 226 on the pressure contact side 205 of the BAW die 202 is determined by adjusting a count value associated with an oscillation frequency of the reference BAW resonator 212 based on a count value associated with an oscillation frequency of the sensor BAW resonator 210 to determine a corrected frequency value, which can then be converted to a pressure value. As both the reference BAW resonator 212 and the sensor BAW resonator 210 are fabricated in the same process, on the same die, and in close proximity, their different layer thicknesses, properties, and temperature dependence match very well. The difference between the two resonance frequencies is primarily due to external pressure.

Figure 3:
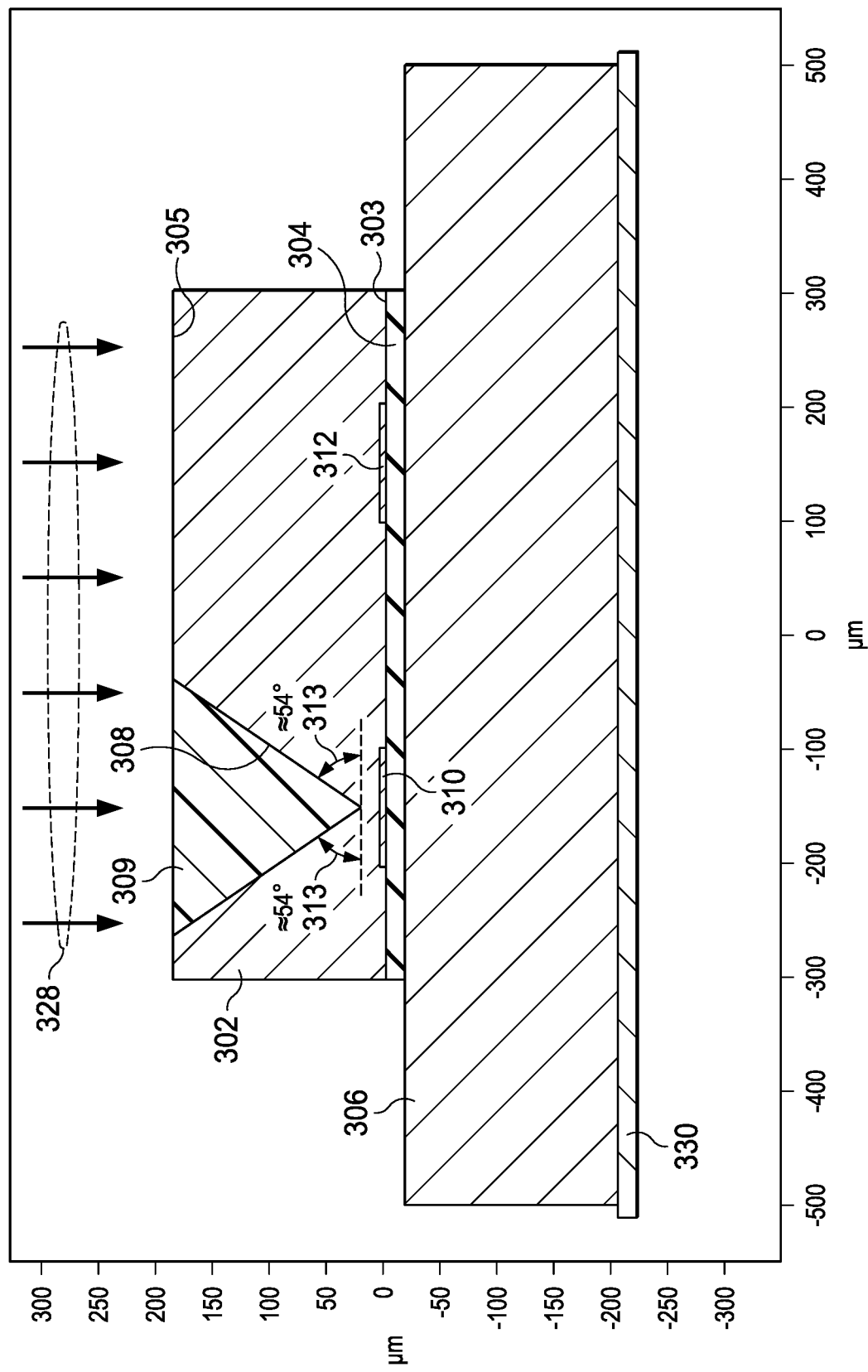
FIG. 3 depicts a cross-sectional view of another example BAW resonator pressure sensor.

FIG. 3 depicts a cross-sectional view of another example BAW resonator pressure sensor 300. The example BAW resonator pressure sensor 300 shown in FIG. 3 is similar to the example BAW resonator pressure sensor 200 shown in FIG. 2, except that the BAW resonator pressure sensor 300 shown in FIG. 3 does not have a lid covering the surface of the BAW die 302 on the pressure contact side 305, and the extended opening 308 is not filled with a soft material but is rather open to air, liquid, and/or gas 309.

As shown in FIG. 3, the BAW resonator pressure sensor 300 device is approximately 1000 micrometers (μm) wide (spanning a width along the shown dimensions from approximately −500 μm to approximately 500 μm) and approximately 425 μm tall (spanning a height along the shown dimensions from approximately −225 μm to approximately 200 μm). A sensor BAW resonator 310 and a reference BAW resonator 312 are disposed on the die interface side 303 of the BAW die 302. The BAW resonator pressure sensor 300 also includes a CMOS die 306 coupled to the die interface side 303 of the BAW die 302 via an attachment layer 304. In some examples, the attachment layer 304 is a dielectric material. In some examples, the attachment layer 304 is polydimethylsiloxane (PDMS), bismaleimide, or soft die attach glue. The CMOS die 306 includes the oscillators and control configured to determine an amount of an external pressure 328 applied to the pressure contact side 305 of BAW die 302, and more generally, the amount of external pressure 328 applied to the BAW resonator pressure sensor 300 device.

The BAW resonator pressure sensor 300 includes an extended opening 308 on the pressure contact side 305 that extends into a depth of the BAW die 302 and is generally aligned with the sensor BAW resonator 310. In the example shown in FIG. 3, the extended opening 308 has a sloped sidewall angle 313 (on both sides) of about 54°. However, the shape of the extended opening 308 can vary and can be of many different shapes (e.g., the sloped sidewall angle 313 (on either side) can be an angle other than 54°). The extended opening 308 is configured to translate and concentrate the external pressure 328 applied to the pressure contact side 305 onto the sensor BAW resonator 310. Put another way, the extended opening 308 funnels, and in some examples concentrates, the external pressure 328 applied to the pressure contact side 305 onto the sensor BAW resonator 310. In FIG. 3, the extended opening 308 is generally funnel-shaped, and is open to air, liquid, and/or gas 309. The BAW resonator pressure sensor 300 also includes a fixed boundary 330 to separate the BAW resonator pressure sensor 300 from other material or objects. A magnitude of the external pressure 328 applied to the pressure contact side 305 of the BAW die 302 is determined by adjusting a count value associated with an oscillation frequency of the reference BAW resonator 312 based on a count value associated with an oscillation frequency of the sensor BAW resonator 310, and converting the adjusted count value to a pressure value. As both the reference and sensor BAW are fabricated in the same process, on the same die, and in close proximity, their different layer thicknesses, properties, and temperature dependence match very well. Therefore, the difference between the two resonance frequencies is primarily due to external pressure.

Figure 4A:
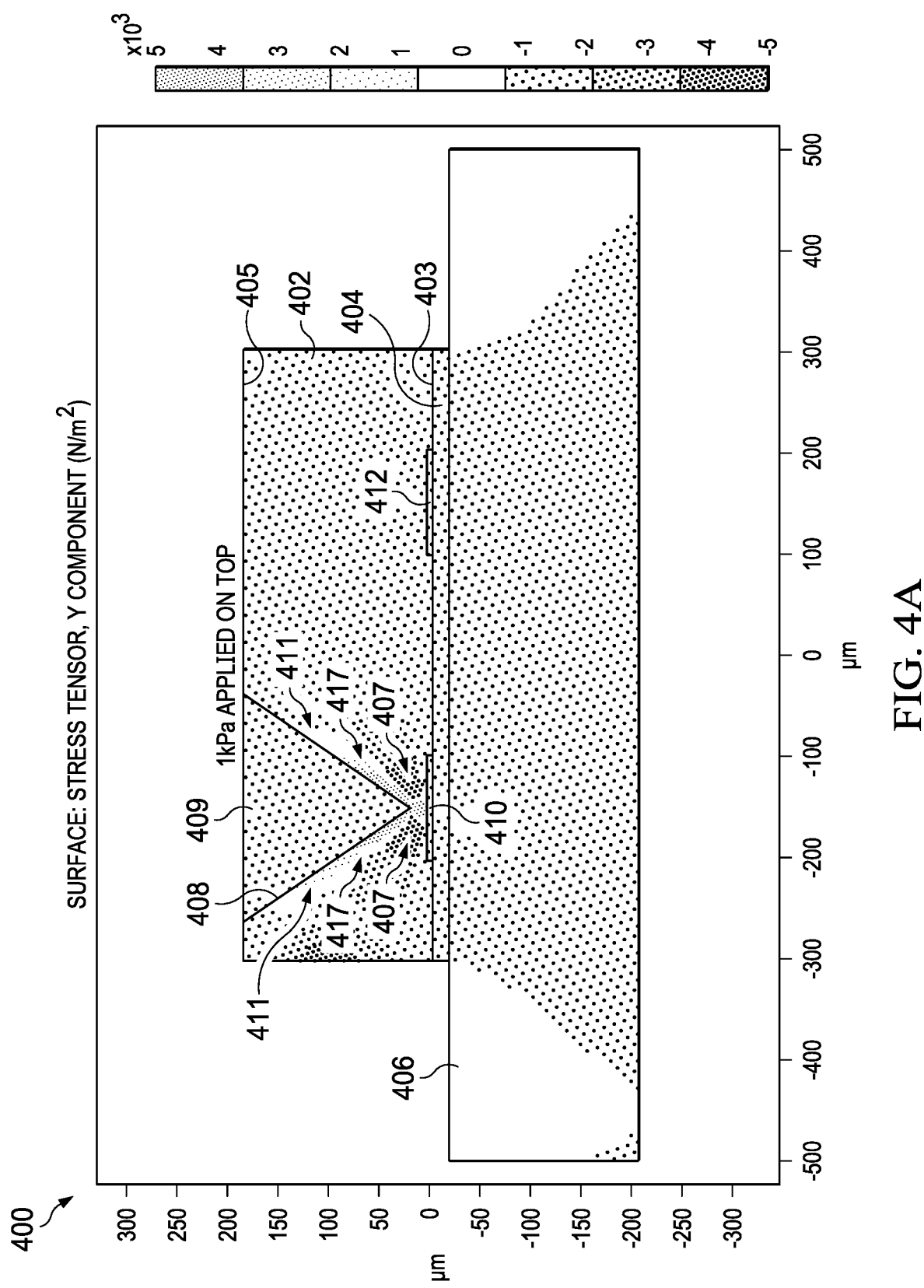
FIG. 4A depicts the stress distribution of a BAW resonator pressure sensor during a finite element method (FEM) simulation.
Figure 4B:
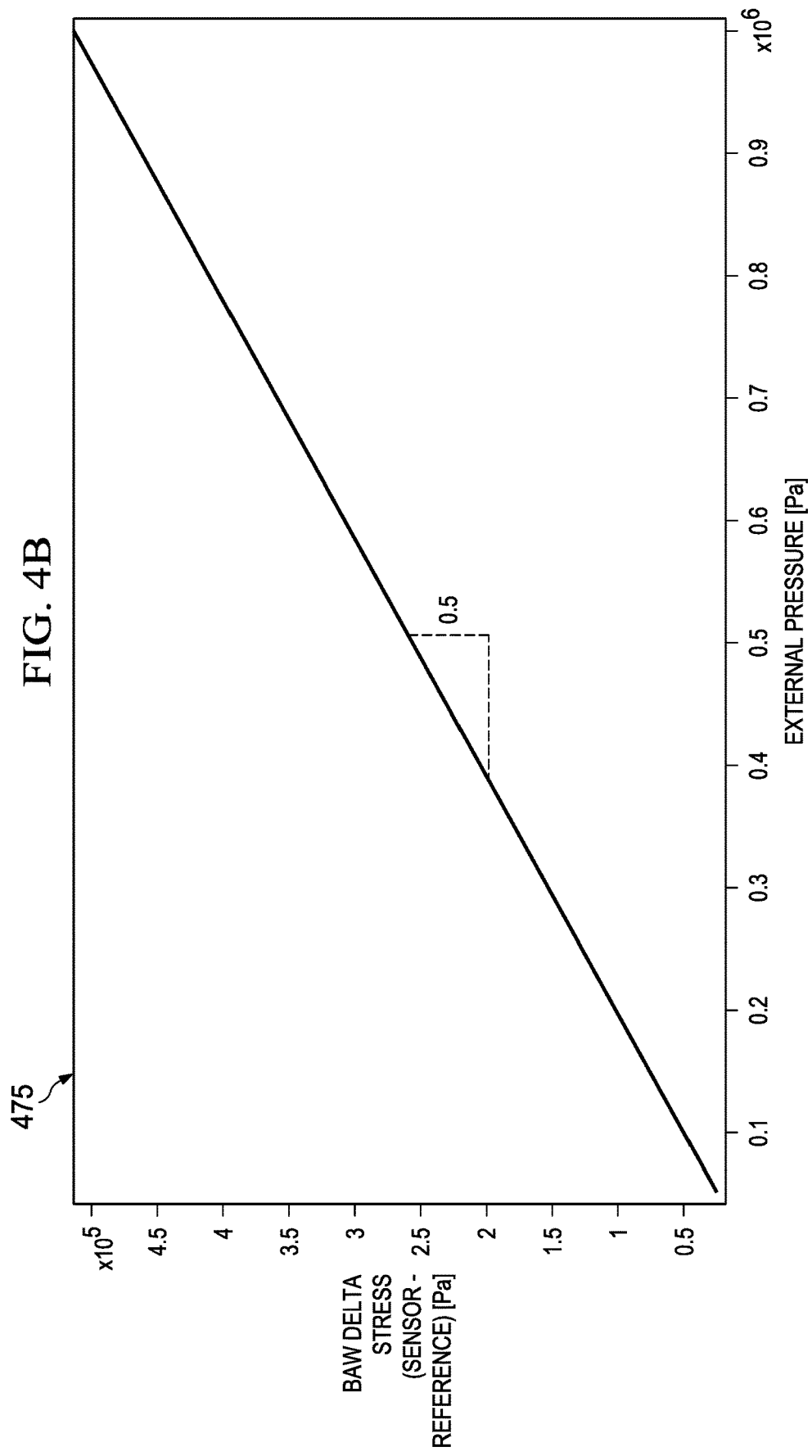
FIG. 4B is a graph showing the change in stress as a function of external pressure applied to a BAW resonator pressure sensor during an FEM simulation.

FIGS. 4A-4B depict the results of a FEM simulation of applying stress to a BAW resonator pressure sensor, such as the BAW resonator pressure sensor 100 illustrated in FIG. 1. During the FEM simulation, stress is applied uniformly on the surface of the BAW die 402 along the pressure contact side 405. In some examples the surface of the BAW die 402 includes a lid/cap having a hard coating.

FIG. 4A depicts the stress distribution 400 of a BAW resonator pressure sensor during the FEM simulation. In FIG. 4A, the magnitude of the stress applied to the pressure contact side 405 is 1 kilopascal (kPa). As shown in FIG. 4A, the extended opening 408 focuses/translates the stress (the external pressure of 1 kPA) on the sensor BAW resonator 410. The reference BAW resonator 412 is unaffected. As shown in FIG. 4A, the magnitude of the stress near the regions 407 close to the portion of the extended opening 408 proximate the die interface side 403 of the BAW die 402 is approximately $-5 \times 10^3$ N/m$^2$, the magnitude of the stress near the regions 417 along the sides of the extended opening 408 is approximately $5 \times 10^3$ N/m$^2$, and the magnitude of the stress near the regions 411 along the sides of the extended opening 408 is approximately 0 N/m$^2$. Whereas, the magnitude of the stress near the other parts of the BAW resonator pressure sensor is between 0 N/m$^2$ and $-0.5 \times 10^3$ N/m$^2$, including areas of the BAW die 402, die attachment layer 404, control circuit die 406, and area 409 within the extended opening 408.

FIG. 4B is a graph 475 showing the change in stress as a function of external pressure applied to the BAW resonator pressure sensor during a FEM simulation. The graph 475 in FIG. 4B shows a linear relationship between the external pressure (shown on the x-axis and measured in pascals (Pa)) and the corrected pressure value (shown on the y-axis and measured in pascals (Pa)). The corrected pressure value is the difference in oscillation frequency between the sensor BAW resonator 410 and the reference BAW resonator 412 (referred to as "BAW Delta Stress (Sensor-Reference) [Pa]" on the y-axis in FIG. 4B). The slope of the linear relationship is shown in the FEM simulation to be approximately 5 Pa.

Figure 5:
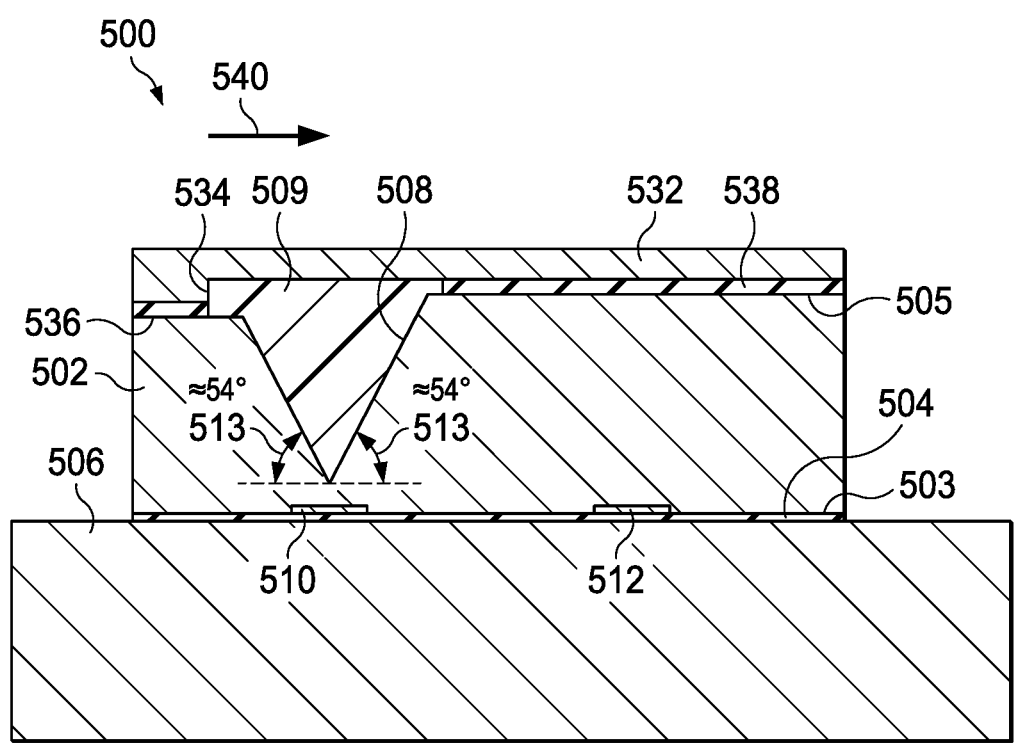
FIG. 5 illustrates a cross-sectional view of an example BAW resonator shear stress sensor (SSS).

FIG. 5 illustrates a cross-sectional view of an example BAW resonator SSS 500. The BAW resonator SSS 500 of FIG. 5 has a similar structure as the BAW resonator pressure sensor depicted in FIG. 1, except that the BAW resonator SSS 500 of FIG. 5 includes a cap 532 configured to cover a surface of the BAW die on the pressure contact side 505. In some examples, the cap 532 is made of silicon. The cap 532 includes a lip portion 534 orthogonal to a portion of the extended opening 508 and a portion of the pressure contact side 505. The BAW resonator SSS 500 is configured to sense a shear stress 540 associated with an external pressure. The cap 532 is coupled to the BAW die 502 via a cap attachment layer 538. In some examples, the cap 532 is created by a mesa etch, the lip portion 534 and a lower side 536 of the cap attachment layer 538 is created by a silicon mesa etch, and the cap attachment layer is a dielectric material. A mesa etch is a flat etch on the wafer surface. The term "mesa" is used because the mesa etch resembles an isolated flat-topped hill with steep sides, as found in landscapes with horizontal strata.

As shown in FIG. 5, a sensor BAW resonator 510 and a reference BAW resonator 512 are disposed on the die interface side 503 of the BAW die 502. The BAW resonator SSS 500 also includes a control circuit die 506 coupled to the die interface side 503 of the BAW die 502 via an attachment layer 504. In some examples, the control circuit die 506 is a CMOS die. In some examples, the attachment layer 504 is a dielectric material. In some examples, the attachment layer 504 is made of polydimethylsiloxane (PDMS), bismaleimide, or soft die attach glue. The control circuit die 506 includes the oscillators and control configured to determine an amount of an external pressure (including shear stress 540) applied to the pressure contact side 505 of BAW die 502. Thus, the BAW resonator SSS 500 is configured to determine the amount of an external pressure (including shear stress 540) applied to the BAW resonator SSS 500 device.

The BAW resonator SSS 500 includes an extended opening 508 on the pressure contact side 505 that extends into a depth of the BAW die 502 and is generally aligned with the sensor BAW resonator 510. In some examples, the extended opening 508 is fabricated using a chemical etch. In the example shown in FIG. 5, the extended opening 508 has a sloped sidewall angle 513 (on both sides) of about 54°. However, the shape of the extended opening 508 can vary and can be of many different shapes (e.g., the sloped sidewall angle 513 (on either side) can be an angle other than 54°). The extended opening 508 is configured to translate the external pressure (including the shear stress 540) applied to the pressure contact side 505 onto the sensor BAW resonator 510. Put another way, the extended opening 508 funnels the external pressure (including the shear stress 540) applied to the pressure contact side 505 onto the sensor BAW resonator 510. In FIG. 5, the extended opening 508 is generally funnel-shaped, and is filled with a soft material 509 such as polydimethylsiloxane (PDMS) or bismaleimide. A magnitude of the external pressure (including a shear stress 540) applied to the pressure contact side 505 of the BAW die 502 is determined by adjusting a count value associated with an oscillation frequency of the reference BAW resonator 512 based on a count value associated with an oscillation frequency of the sensor BAW resonator 510, and converting the adjusted count value to determine a pressure value including a pressure value of the shear stress 540.

FIGS. 6A-6E depict the results of a FEM simulation of applying stress to a BAW resonator shear stress sensor (SSS), such as the BAW resonator SSS 500 depicted in FIG. 5. During the FEM simulation, a shear stress is applied to the cap 632 along the pressure contact side 605 of the BAW die 602.

Figure 6A:
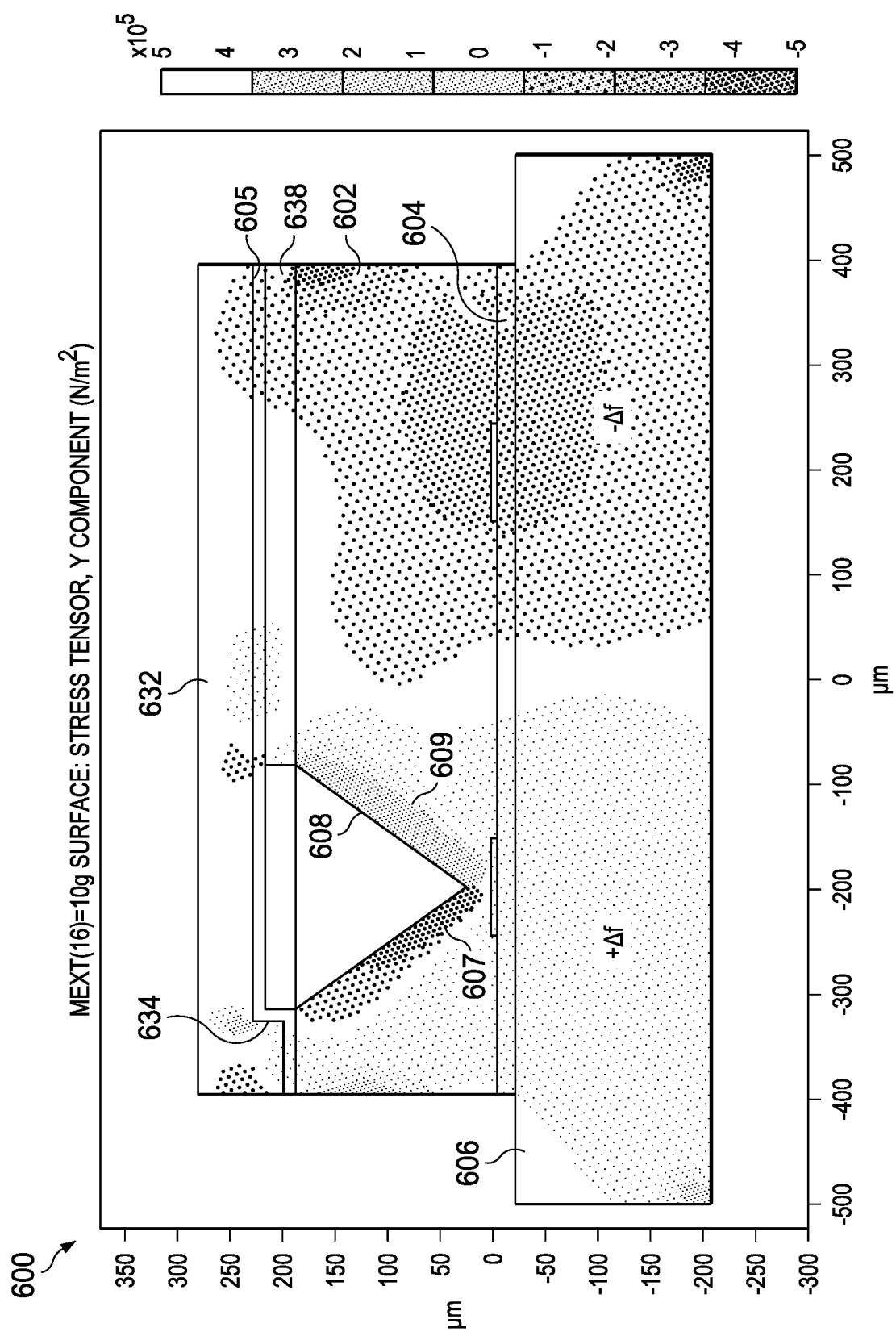
FIG. 6A depicts the delta stress distribution of a BAW resonator SSS during an FEM simulation.

FIG. 6A depicts the delta stress distribution 600 of the BAW resonator SSS during the FEM simulation. As shown in FIG. 6A, the lip portion 634 of the cap 632 orthogonal to a portion of the extended opening 608 and a portion of the pressure contact side 605, where the shear pressure is applied, experiences a change in stress of approximately $5 \times 10^5$ N/m². Also, as shown in FIG. 6A, the extended opening 608 focuses the stress within the region 607 and the region 609 near the extended opening 608. Region 607 has experienced a change in stress of $-5 \times 10^5$ N/m², while region 609 has experienced a change in stress of $5 \times 10^5$ N/m². Thus, FIG. 6A distinguishes between shear in +x and shear in −x. Other areas of the BAW resonator SSS experience a smaller change in stress, including within the control circuit die 606, the die attachment layer 604, the BAW die 602, the cap 632, and the cap attachment layer 638.

Figure 6B:
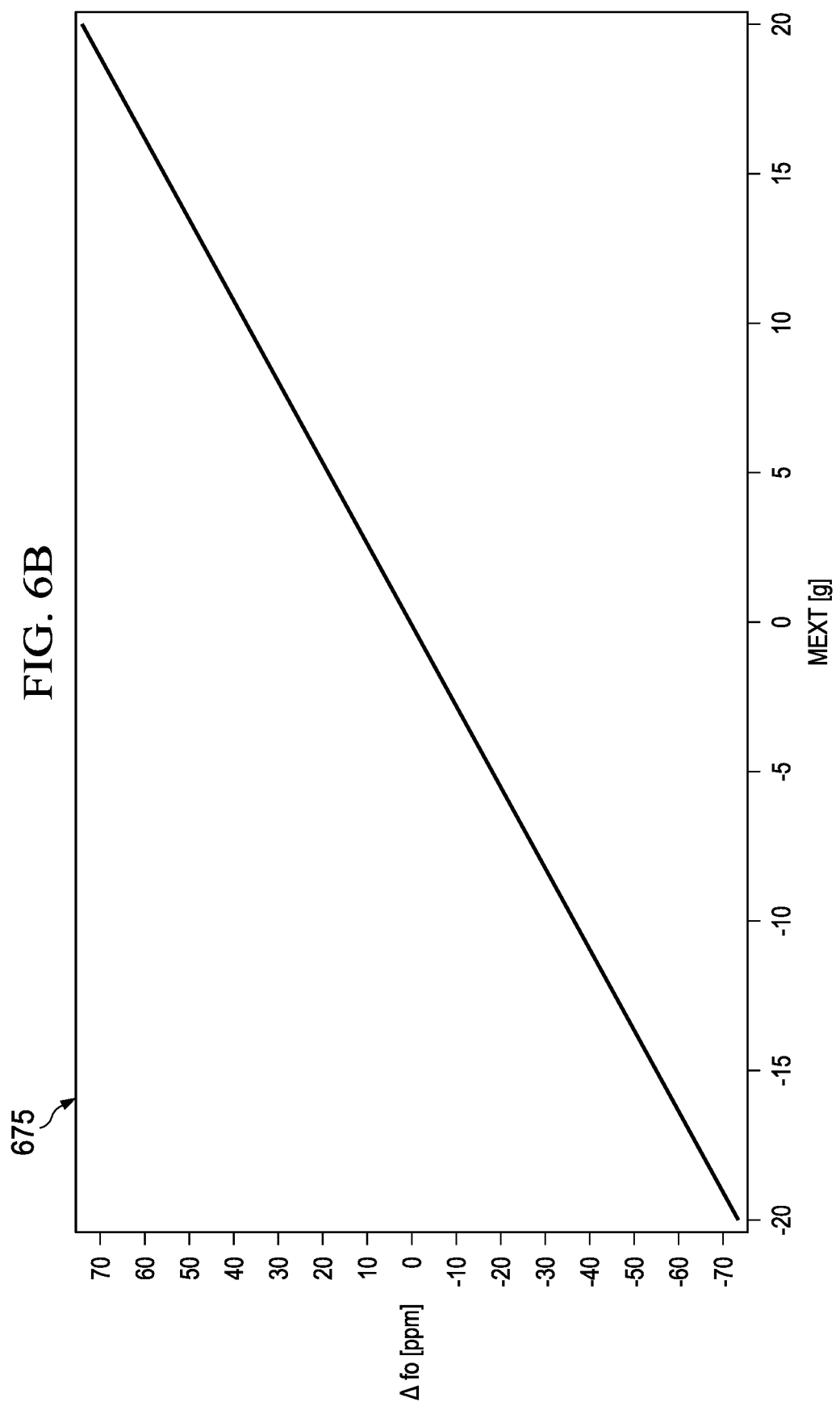
FIG. 6B is a graph showing the change in stress as a function of external pressure applied to a BAW resonator SSS during an FEM simulation.

FIG. 6B is a graph 675 showing the change in stress as a function of external pressure applied to the BAW resonator SSS during the FEM simulation. The graph in FIG. 6B shows a linear relationship between the external pressure (shown on the x-axis and measured in Mext [g]) and the change in stress (shown on the y-axis and measured in Δfo [ppm]). The slope of the linear relationship is shown in the FEM simulation to be approximately 3.685 ppm/g.

Figure 6C:
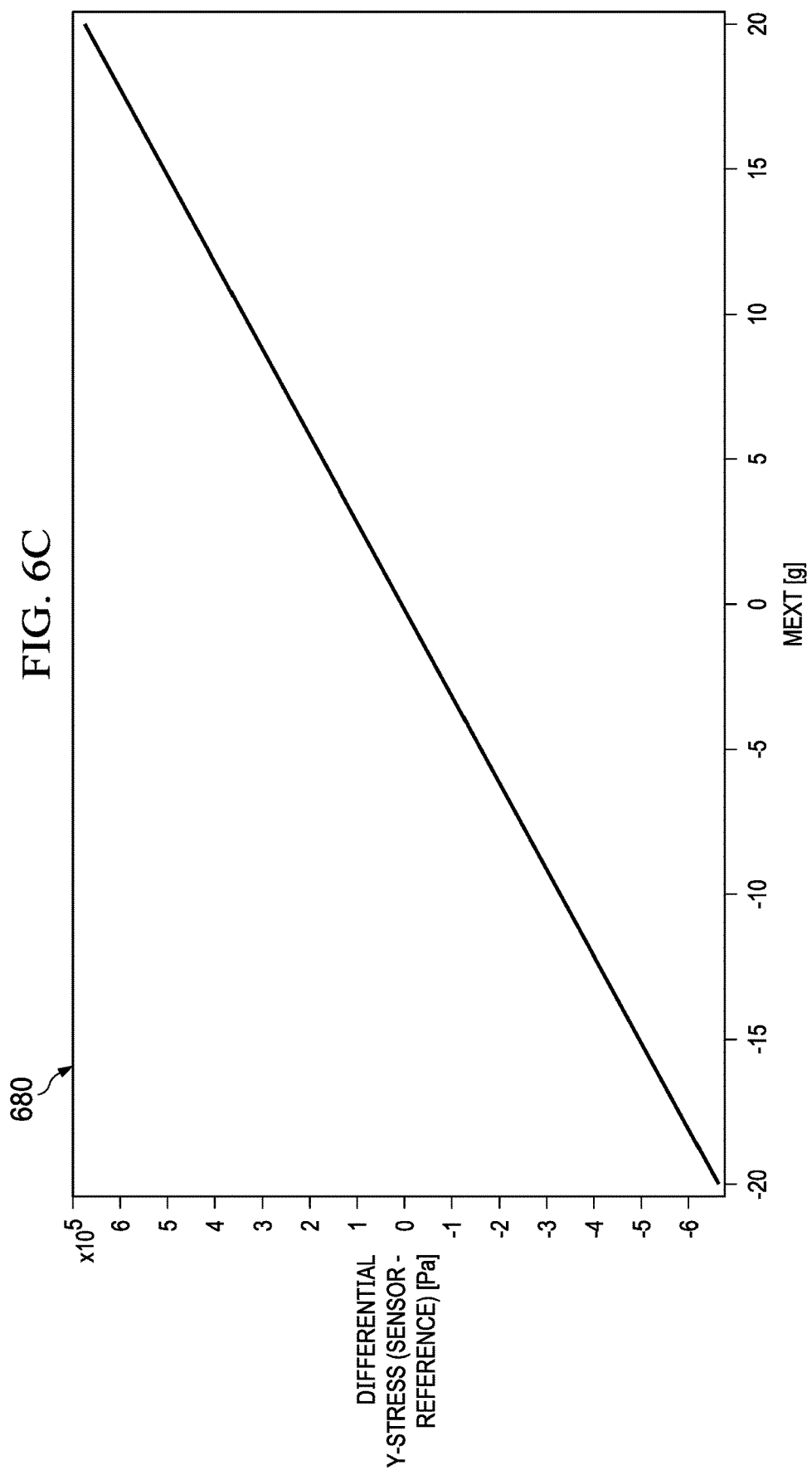
FIG. 6C is another graph showing the change in stress as a function of external pressure applied to a BAW resonator SSS during an FEM simulation.

FIG. 6C is another graph 680 showing the change in stress as a function of external pressure applied to the BAW resonator SSS during the FEM simulation. The graph 680 in FIG. 6C shows a linear relationship between the external pressure (shown on the x-axis and measured as the weight of an external mass (Mext) in grams) and the corrected pressure value. The corrected pressure value is the difference in oscillation frequency between the sensor BAW resonator and the reference BAW resonator (referred to as "Differential Y-Stress (Sensor-Reference) [Pa]" on the y-axis in FIG. 6C). The slope of the linear relationship is shown in the FEM simulation to be approximately 0.4 Pa/g.

Figure 6D:
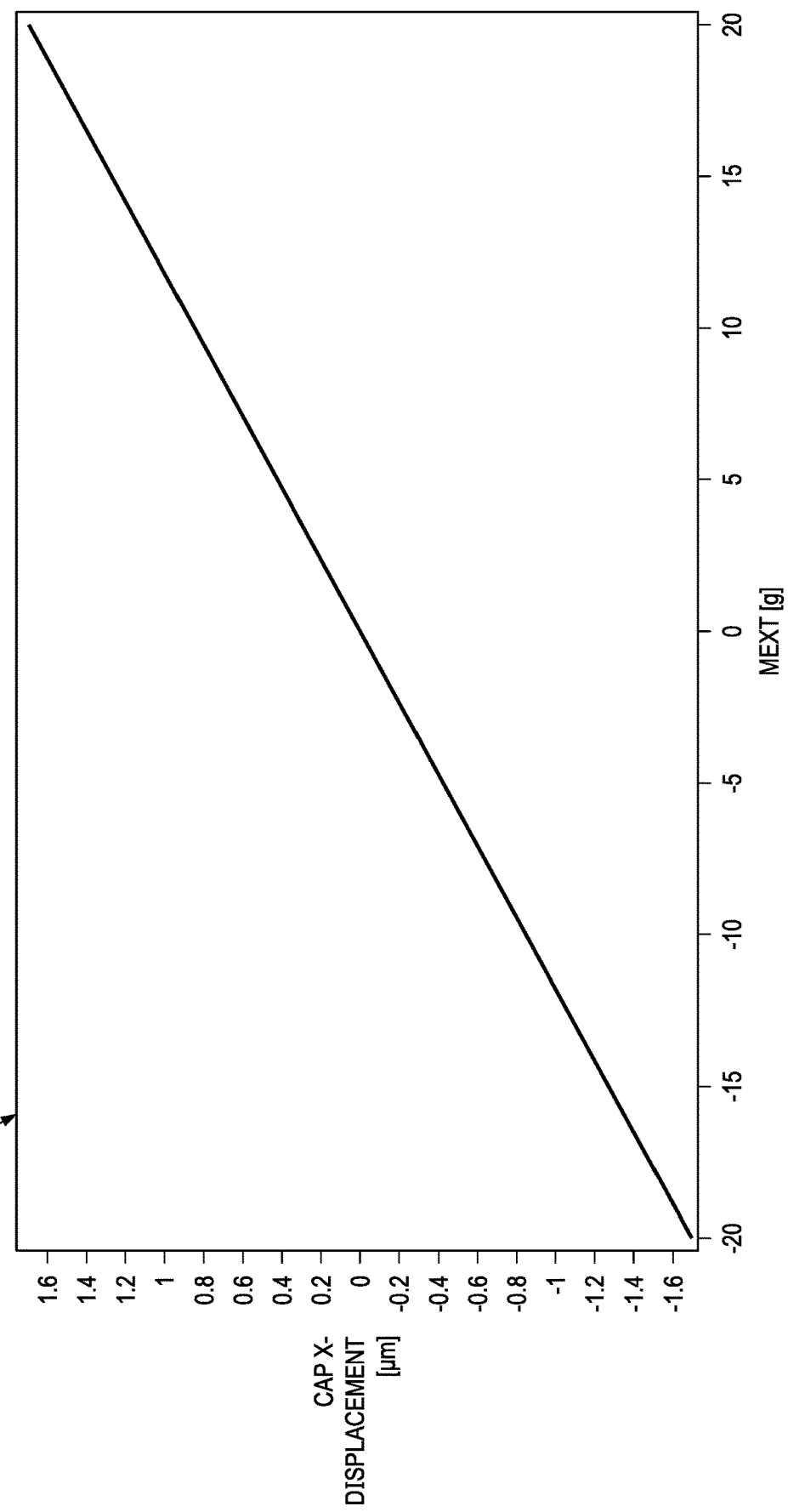
FIG. 6D is a graph showing cap displacement as a function of external pressure applied to a BAW resonator SSS during an FEM simulation.

FIG. 6D is a graph 685 showing cap displacement as a function of external pressure applied to the BAW resonator SSS during the FEM simulation. The graph in FIG. 6D shows a linear relationship between the amount of pressure applied to the BAW resonator SSS (shown on the x-axis as the weight of an external mass (Mext) in grams and the cap displacement (shown on the y-axis as Cap x-displacement [μm]). The linear relationship is shown in FIG. 6D to be approximately 0.4 μm/g.

FIG. 6E depicts displacement distribution 690 of the BAW resonator shear stress sensor (SSS) during the FEM simulation. As shown in FIG. 6E, the displacement of the cap 632 is approximately 1.6 μm, the displacement of the BAW die 602 is approximately 1 μm, and the displacement of the control circuit die 606 is approximately 0.0 μm.

Figure 7:
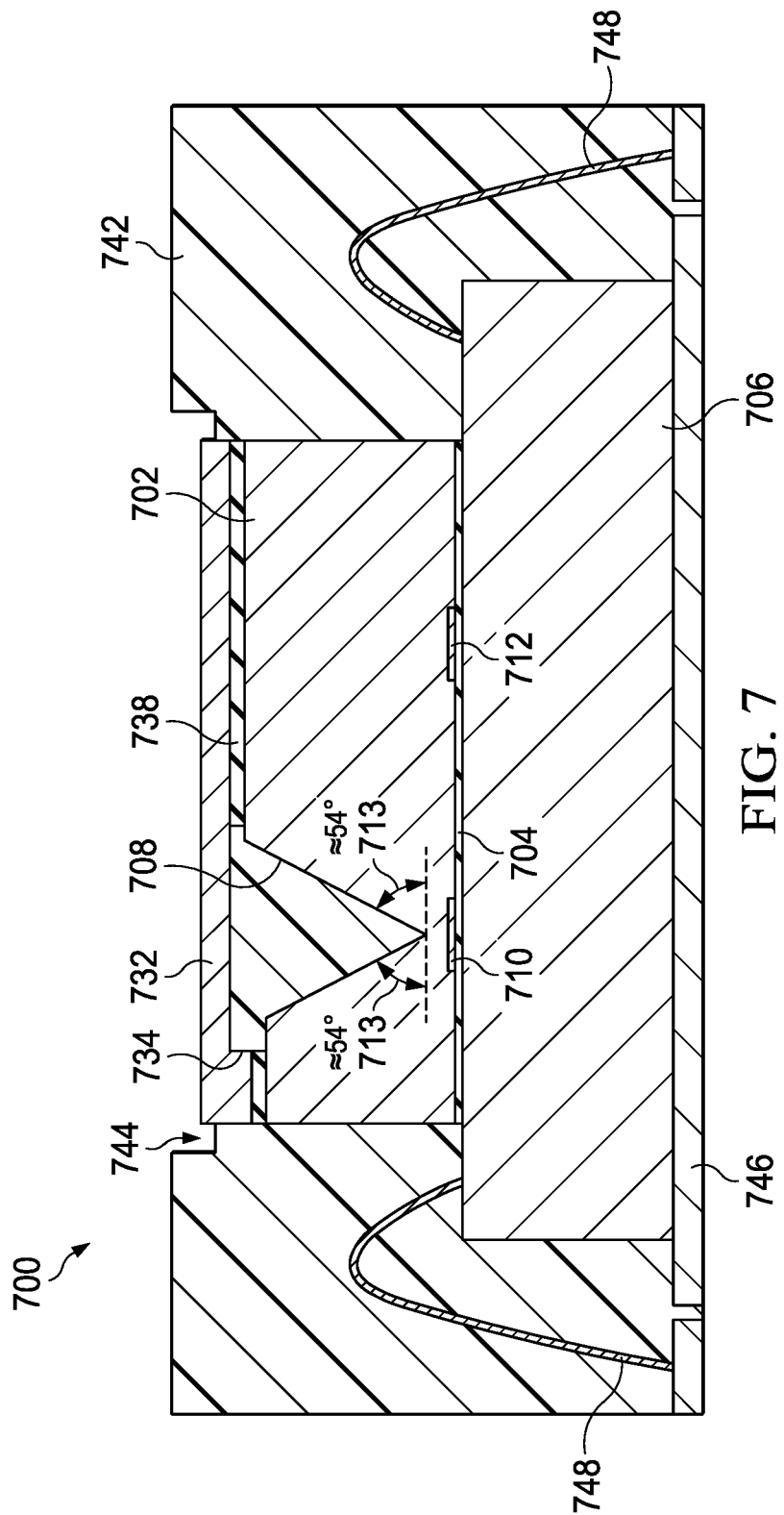
FIG. 7 shows an example packaging of a BAW resonator SSS.

FIG. 7 shows a package 700 of a BAW resonator shear stress sensor (SSS) (such as the BAW resonator SSS of FIG. 5). In the packaging example shown in FIG. 7, the BAW resonator SSS is placed onto the lead frame 746. The control circuit die 706 (e.g., a CMOS die) is wirebonded using wirebonding material 748. The surrounding areas are filled with a plastic mold 742. Additionally, a package opening 744 is fabricated such that the cap 732 is exposed and sensitive to stress. Like the BAW resonator SSS 500 shown in FIG. 5, the BAW resonator SSS within the package in FIG. 7 additionally includes a BAW die 702, an extended opening 708 having a sidewall angle 713 (on both sides) of about 54°, the extended opening 708 being configured to translate an external pressure onto a sensor BAW resonator 710, a reference BAW resonator 712, a lip 734 orthogonal to a portion of the extended opening 708 and the cap 732, as well as a die attachment layer 704 and a cap attachment layer 738.

Figure 8:
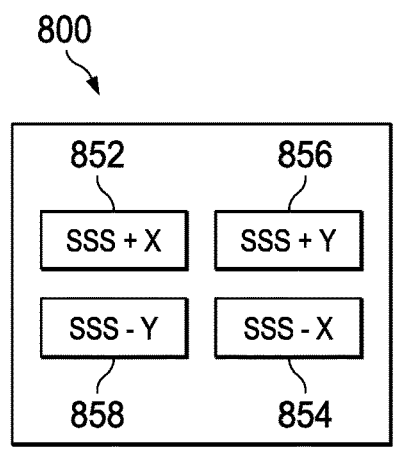
FIG. 8 shows an example tactile sensor pixel.

FIG. 8 shows a tactile sensor pixel 800. The tactile sensor pixel 800 is fabricated by arranging four BAW resonator SSS (such as the BAW resonator SSS 500 of FIG. 5 or the BAW resonator SSS 700 shown in the packaging 700 of FIG. 7) in the configuration shown in FIG. 8. Thus, the tactile sensor pixel 800 includes an SSS+x BAW resonator SSS apparatus 852, an SSS−x BAW resonator SSS apparatus 854, an SSS+y BAW resonator SSS apparatus 856, and an SSS−y BAW resonator SSS apparatus 858, arranged as shown in FIG. 8. The shear applied to the tactile sensor pixel 800 can be expressed by the differential frequency shift equations Sx=SSS+x−SSS−x, and Sy=SSS+y−SSS−y. The resulting pressure can be expressed by the common frequency shift equation Pz=SSS+x+SSS−x+SSS+y+SSS−y. In some examples, the tactile sensor pixel 800 is used for robotic arms (to detect stress while holding objects). Multiple tactile sensor pixels (such as the tactile sensor pixel 800 shown in FIG. 8), can detect object rotation. Accordingly, FIG. 8 tactile sensor pixel comprising four apparatuses depicted in FIG. 7, such that a first BAW resonator SSS apparatus 852 is configured to sense shear in a positive horizontally lateral direction, a second BAW resonator SSS apparatus 854 is configured to sense shear in a negative horizontally lateral direction, a third BAW resonator SSS apparatus 856 is configured to sense shear in a positive vertically lateral direction, and a fourth BAW resonator SSS apparatus 858 is configured to sense shear in a negative vertically lateral direction.

Figure 9:
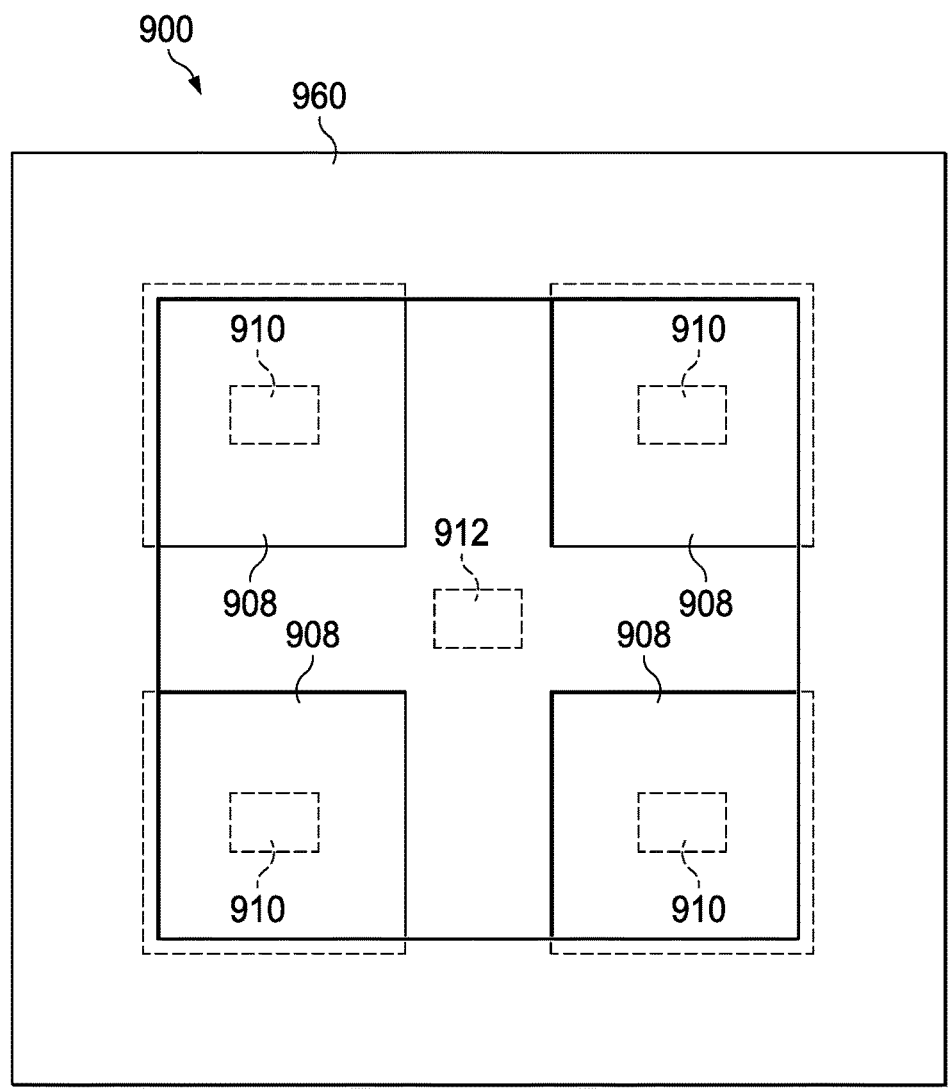
FIG. 9 shows an example tactile sensor apparatus.

FIG. 9 shows an example tactile sensor apparatus 900. The tactile sensor apparatus 900 includes four sensor BAW resonators 910 that are sensitive to an external pressure including a shear (though a different number of sensor BAW resonators could be used), and a reference BAW resonator 912 that is protected from external pressure and shear effects. The tactile sensor apparatus 900 also includes a cap 960 configured to accept an external pressure. In some examples, the cap 960 is fabricated using a mesa etch. The tactile sensor apparatus 900 also includes four extended openings 908, each extended opening 908 corresponding to a respective one of the sensor BAW resonators 910 and configured to translate external pressure applied to a respective portion of the cap 960 to a respective one of the sensor BAW resonators 910.

In other examples, the number of extended openings is different from four, as the number of extended openings depend on the number of sensor BAW resonators used. While not shown in FIG. 9, the tactile sensor apparatus 900 also includes a number of sensor control inductors respectively coupled to respective sensor inductors of the respective sensor BAW resonators 910 (similar to the configuration of the sensor control inductor 114 and sensor inductor 198 shown in FIG. 1). The tactile sensor apparatus 900 also includes a number of sensor oscillators coupled respectively to the number of sensor control inductors. The number of sensor oscillators are coupled respectively to a number of sensor counters. The number of respective sensor counters are configured to count respective oscillation frequencies of the respective plurality of sensor oscillators. The respective oscillation frequencies are primarily a function of respective resonance frequencies of the respective sensor BAW resonators 910 and hence the externally applied pressure, with substantially minimal (e.g., weak) dependence on the mutual inductance of the respective sensor control inductors and sensor inductors.

Also, while not shown in FIG. 9, the tactile sensor apparatus 900 also includes a reference control inductor inductively coupled a reference inductor of the reference BAW resonator 912 (similar to the configuration of the reference control inductor 116 and the reference inductor 199 shown in FIG. 1). The tactile sensor apparatus 900 also includes a reference oscillator coupled to the reference control inductor. The reference oscillator is coupled to a reference counter which is configured to count an oscillation frequency of the reference oscillator. The tactile sensor apparatus 900 also includes a control circuit configured to read the number of sensor counters to determine a number of respective sensor BAW resonator frequencies, and the reference counter to determine a reference BAW resonator frequency. A magnitude of an external pressure applied to the cap 960 is determined by adjusting a count value associated with the reference BAW resonator based on count values associated with the plurality of sensor BAW resonators 910, and converting the adjusted count value to determine a pressure value. In some examples, the extended openings 908 are filled with a soft material having a Young's modulus of less than 20 MPa. In some examples, the extended openings 908 are made of polydimethylsiloxane, bismaleimide, and/or soft die attach glue.

Figure 10:
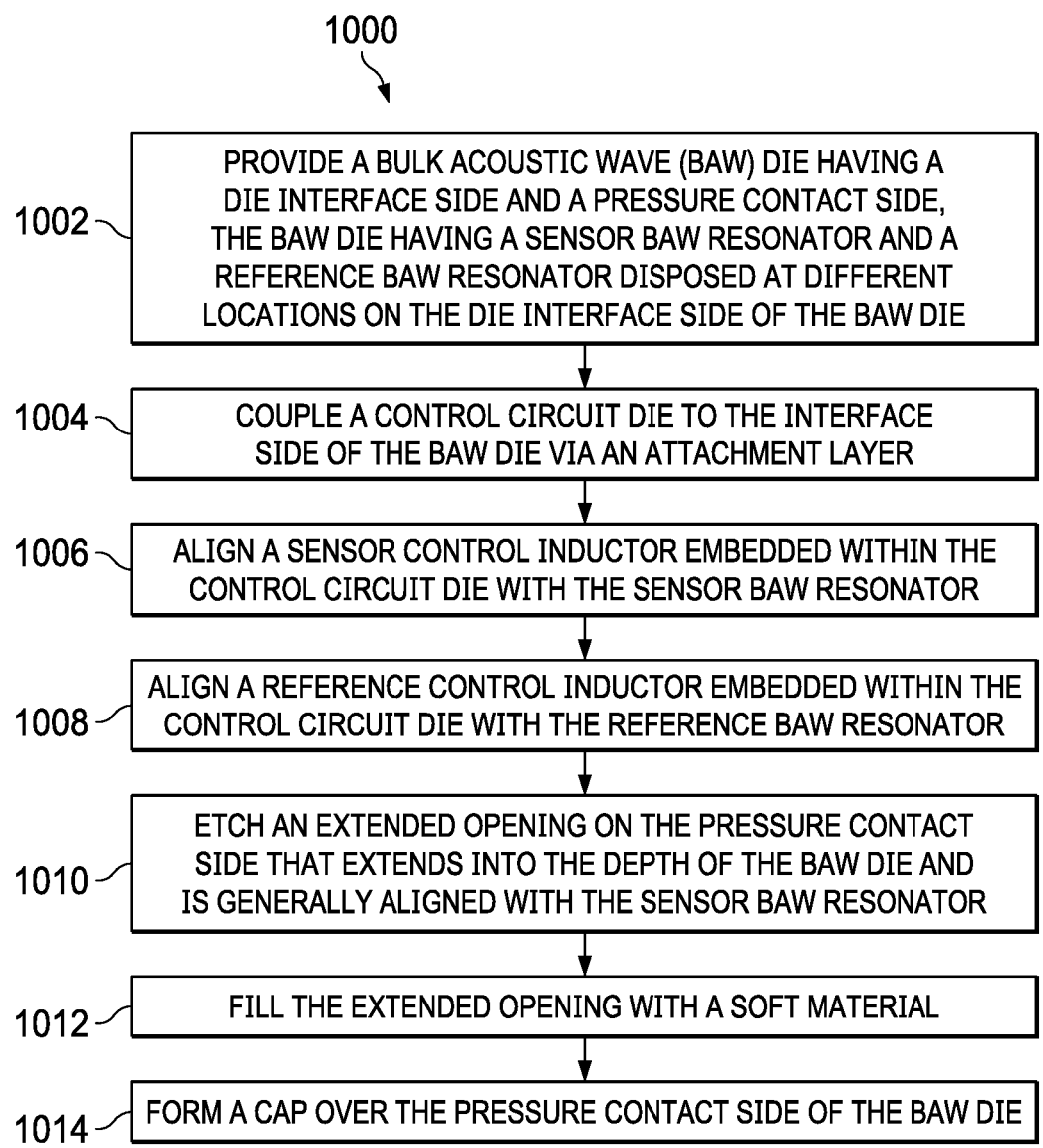
FIG. 10 is an example method of fabricating a BAW resonator pressure sensor.

FIG. 10 is an example method 1000 of fabricating a BAW resonator pressure sensor, such as the BAW resonator pressure sensor 100 of FIG. 1, the BAW resonator pressure sensor 200 of FIG. 1, the BAW resonator pressure sensor 300 of FIG. 3, and/or the BAW resonator SSS 500 of FIG. 5). At 1002, a BAW die having a die interface side and a pressure contact side is provided. The BAW die has a sensor BAW resonator and a reference BAW resonator disposed at different locations on the die interface side of the BAW die. At 1004, a control circuit die is coupled to the die interface side of the BAW die via an attachment layer. At 1006, a sensor control inductor embedded within the control circuit die is aligned with the sensor BAW resonator. At 1008, a reference control inductor embedded within the control circuit die is aligned with the reference BAW resonator. At 1010, an extended opening is etched on the pressure contact side that extends into a depth of the BAW die and is generally aligned with the sensor BAW resonator. The extended opening is configured to translate an external pressure applied to the pressure contact side of the BAW die onto the sensor BAW resonator. In some examples, the etching of the extended opening employs a KOH etching, a TMAH etching, or a DRIE. At 1012, the extended opening is filled with a soft material. In some examples, the soft material has a Young's modulus of less than 20 megapascals. In some examples, the soft material is made of polydimethylsiloxane, bismaleimide, or soft die attach glue. At 1014, a cap is formed over the pressure contact side of the BAW die. The cap includes a lip portion orthogonal to a portion of the extended opening and a portion of the pressure contact side and is configured to sense a shear stress associated with the external pressure.

In the method shown in FIG. 10, the sensor control inductor is inductively coupled to a sensor inductor of the sensor BAW resonator. A sensor oscillator is coupled to the sensor control inductor, the sensor oscillator coupled to a sensor counter, the sensor counter being configured to count an oscillation frequency of the sensor oscillator which is a function of a sensor BAW resonator resonance frequency and externally applied pressure, with a substantially minimal dependence on a mutual inductance of the sensor control inductor and the sensor inductor. The reference control inductor is inductively coupled to a reference inductor of the reference BAW resonator. A reference oscillator is coupled to the reference control inductor, the reference oscillator coupled to a reference counter which is configured to count an oscillation frequency of the reference oscillator. A control circuit embedded within the control circuit die is configured to read the sensor counter to determine a sensor BAW resonator frequency, and the reference counter to determine a reference BAW resonator frequency. A magnitude of an external pressure (in some examples, the external pressure includes a shear pressure) applied to the pressure contact side of the BAW die is determined by adjusting a count value associated with the reference BAW resonator based on a count value associated with the sensor BAW resonator, and converting the adjusted count value to a determined pressure value.

What have been described above are examples. It is not possible to describe every conceivable combination of components or methodologies. Many further combinations and permutations are possible. Accordingly, the disclosure is intended to embrace all such alterations, modifications, and variations that fall within the scope of this application, including the appended claims. The term "based on" means based at least in part on. Additionally, where the disclosure or claims recite "a," "an," "a first," or "another" element, or the equivalent thereof, it should be interpreted to include one or more than one such element, neither requiring nor excluding two or more such elements.

What is claimed is:

1. A pressure sensor apparatus, comprising:
   a bulk acoustic wave (BAW) die having a die interface side and a pressure contact side, the BAW die including a sensor BAW resonator and a reference BAW resonator coupled to the die interface side;
   an attachment layer;
   a control circuit die coupled to the die interface side via the attachment layer; and
   the pressure contact side having an opening that extends into the BAW die toward the sensor BAW resonator, the opening configured to translate a pressure from the pressure contact side to the sensor BAW resonator.

2. The apparatus of claim 1, wherein:
   the BAW die further includes a sensor inductor coupling the sensor BAW resonator to the die interface side and a reference inductor coupling the reference BAW resonator to the die interface side; and
   the control circuit die includes:
     a sensor control inductor configured to inductively couple to the sensor inductor;
     a sensor oscillator coupled to the sensor control inductor;
     a sensor counter coupled to the sensor oscillator, wherein the sensor counter is configured to count an oscillation frequency of the sensor oscillator which is a function of a sensor BAW resonator resonance frequency and the pressure;
     a reference control inductor configured to inductively couple to the reference inductor;
     a reference oscillator coupled to the reference control inductor;
     a reference counter coupled to the reference oscillator, wherein the reference counter is configured to count an oscillation frequency of the reference oscillator which is a function of a reference BAW resonator resonance frequency; and
     a control circuit embedded within the control circuit die, wherein the control circuit is coupled to the sensor counter and the reference counter.

3. The apparatus of claim 2, wherein the control circuit is configured to:
   read a first count value of the sensor counter;
   adjust a second count value of the reference counter based the first count value; and
   determine, based on the adjusted second count value, a pressure value indicating a magnitude of the pressure.

4. The apparatus of claim 1, wherein the control circuit die is a complementary metal-oxide-semiconductor die.

5. The apparatus of claim 1, further comprising a material within the opening, wherein the material has a Young's modulus of less than 20 megapascals, and comprises polydimethylsiloxane, bismaleimide, or die attach glue.

6. The apparatus of claim 1, wherein the attachment layer comprises polydimethylsiloxane, bismaleimide, or die attach glue.

7. The apparatus of claim 1, further comprising a lid covering a surface of the BAW die on the pressure contact side, wherein the lid receives the pressure and translates the pressure to the opening.

8. The apparatus of claim 1, further comprising a cap covering a surface of the BAW die on the pressure contact side, wherein the cap comprises a lip portion orthogonal to a portion of the opening and a portion of the pressure contact side and is configured to sense a shear stress associated with the pressure.

9. A tactile sensor pixel comprising four apparatuses of claim 8, wherein:
   a first BAW resonator shear stress sensor (SSS) apparatus of the four apparatuses is configured to sense shear in a positive horizontally lateral direction;
   a second BAW resonator SSS apparatus of the four apparatuses is configured to sense shear in a negative horizontally lateral direction;
   a third BAW resonator SSS apparatus of the four apparatuses is configured to sense shear in a positive vertically lateral direction; and
   a fourth BAW resonator SSS apparatus of the four apparatuses is configured to sense shear in a negative vertically lateral direction.

10. A method of fabricating a pressure sensor, the method comprising:
    providing a bulk acoustic wave (BAW) die having a die interface side and a pressure contact side, the BAW die including a sensor BAW resonator and a reference BAW resonator coupled to different locations of the die interface side;
    coupling a control circuit die to the die interface side using an attachment layer; and
    etching an opening on the pressure contact side that extends into the BAW die toward the sensor BAW resonator, wherein the opening is configured to translate a pressure from the pressure contact side to the sensor BAW resonator.

11. The method of claim 10, wherein coupling the control circuit die to the die interface side of the BAW die using the attachment layer includes:
    aligning a sensor control inductor embedded within the control circuit die with the sensor BAW resonator; and
    aligning a reference control inductor embedded within the control circuit die with the reference BAW resonator.

12. The method of claim 11, wherein:
    the sensor control inductor is inductively coupled to a sensor inductor of the sensor BAW resonator;
    a sensor oscillator is coupled to the sensor control inductor, the sensor oscillator coupled to a sensor counter, the sensor counter being configured to count an oscillation frequency of the sensor oscillator which is a function of a sensor BAW resonator resonance frequency and the pressure;
    the reference control inductor is inductively coupled to a reference inductor of the reference BAW resonator;
    a reference oscillator is coupled to the reference control inductor, the reference oscillator coupled to a reference counter which is configured to count an oscillation frequency of the reference oscillator; and
    a control circuit embedded within the control circuit die is configured to read the sensor counter to determine a sensor BAW resonator frequency, and the reference counter to determine a reference BAW resonator frequency.

13. The method of claim 10, wherein the etching of the opening employs a potassium hydroxide (KOH) etching, a tetramethylammonium hydroxide (TMAH) etching, or a deep reactive-ion etching (DRIE).

14. The method of claim 10, further comprising filling the opening with a material having a Young's modulus of less than 20 megapascals, wherein the material comprises polydimethylsiloxane, bismaleimide, or die attach glue.

15. The method of claim 10, further comprising forming a cap over the pressure contact side of the BAW die, wherein the cap comprises a lip portion orthogonal to a portion of the opening and a portion of the pressure contact side and is configured to sense a shear stress associated with the pressure.

16. A tactile sensing apparatus, comprising:
a plurality of sensor bulk acoustic wave (BAW) resonators;
a reference BAW resonator;
a cap configured to accept a pressure; and
a plurality of openings, each opening corresponding to a respective one of the plurality of sensor BAW resonators and configured to translate the pressure from a respective portion of the cap to the respective one of the plurality of sensor BAW resonators.

17. The apparatus of claim 16, further comprising:
a plurality of sensor control inductors respectively coupled to a plurality of sensor inductors of the plurality of respective sensor BAW resonators;
a plurality of sensor oscillators coupled respectively to the plurality of sensor control inductors, the plurality of sensor oscillators coupled respectively to a plurality of sensor counters, the plurality of respective sensor counters being configured to count respective oscillation frequencies of the respective plurality of sensor oscillators, the respective oscillation frequencies of the respective plurality of sensor oscillators being a function of a respective sensor BAW resonator resonance frequencies and the pressure, with a substantially minimal dependence on a mutual inductance of the plurality of the respective sensor control inductors and respective sensor inductors;
a reference control inductor inductively coupled to a reference inductor of the reference BAW resonator;
a reference oscillator coupled to the reference control inductor, the reference oscillator coupled to a reference counter which is configured to count an oscillation frequency of the reference oscillator; and
a control circuit configured to read the plurality of sensor counters to determine a plurality of respective sensor BAW resonator frequencies, and the reference counter to determine a reference BAW resonator frequency.

18. The apparatus of claim 17, wherein a magnitude of the pressure is determined by adjusting a count value associated with the reference BAW resonator based on count values associated with the plurality of sensor BAW resonators, and converting the adjusted count value to determine a pressure value.

19. The apparatus of claim 16, wherein the plurality of openings is filled with a material having a Young's modulus of less than 20 megapascals, and comprise polydimethylsiloxane, bismaleimide, or die attach glue.

20. A pressure sensor apparatus, comprising:
a bulk acoustic wave (BAW) die having opposite first and second sides, the BAW die including first and second BAW resonators coupled to the first side, and the second side having an opening extending into the BAW die toward the first BAW resonator; and
a control circuit die coupled to the first side of the BAW die.

21. The pressure sensor apparatus of claim 20, wherein the opening is funnel-shaped.

22. The pressure sensor apparatus of claim 20, further comprising a material within the opening, wherein the material has a Young's modulus of less than 20 megapascals.

23. The pressure sensor apparatus of claim 20, further comprising a lid covering the second side including covering the opening.

24. The pressure sensor apparatus of claim 23, wherein the lid includes a lip that is orthogonal to a portion of the opening and a portion of the second side.

25. The pressure sensor of claim 23, further comprising a material within the opening.

26. The pressure sensor of claim 23, further comprising a layer of material between the lid and the second side.

27. The pressure sensor apparatus of claim 20, further comprising a material coupling the control circuit die to the first side, the material comprising one or a combination of dielectric material, polydimethylsiloxane, bismaleimide, or die attach glue.

28. The pressure sensor apparatus of claim 20, wherein:
the BAW die further includes:
a first inductor coupling the first BAW resonator to the first side; and
a second inductor coupling the second BAW resonator to the first side;
the control circuit die includes:
a third inductor configured to inductively couple to the first inductor;
a fourth inductor configured to inductively couple to the second inductor;
a first oscillator coupled to the third inductor;
a second oscillator coupled to the fourth inductor; and
a control circuit;
the opening is configured to translate a pressure from the second side to the first BAW resonator; and
the control circuit is configured to detect an oscillation frequency of the first oscillator which is based on a resonance frequency of the first BAW resonator, detect an oscillation frequency of the second oscillator which is based on a resonance frequency of the second BAW resonator, and determine the pressure based on the detected first and second oscillation frequencies.

29. The pressure sensor apparatus of claim 20, wherein:
the BAW die includes a third BAW resonator coupled to the first side; and
the second side includes a second opening extending into the BAW die toward the third BAW resonator.

* * * * *